(12) United States Patent
Shibuya

(10) Patent No.: US 7,676,718 B2
(45) Date of Patent: Mar. 9, 2010

(54) TEST CIRCUIT, METHOD AND APPARATUS FOR SUPPORTING CIRCUIT DESIGN, AND COMPUTER PRODUCT

(75) Inventor: Toshiyuki Shibuya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 786 days.

(21) Appl. No.: 11/363,216

(22) Filed: Feb. 28, 2006

(65) Prior Publication Data

US 2007/0124634 A1 May 31, 2007

(30) Foreign Application Priority Data

Nov. 7, 2005 (JP) ............... 2005-322336

(51) Int. Cl.
*G06F 11/00* (2006.01)
*G06F 17/50* (2006.01)
(52) U.S. Cl. .......................... 714/741; 716/4
(58) Field of Classification Search ............... 714/724, 714/741; 716/4
See application file for complete search history.

(56) References Cited

U.S. PATENT DOCUMENTS

| 5,581,742 | A  | * | 12/1996 | Lin et al. ............... | 716/4 |
| 6,108,794 | A  | * | 8/2000  | Erickson ............... | 713/401 |
| 6,915,503 | B1 | * | 7/2005  | Lesea ................... | 716/16 |
| 7,168,020 | B2 | * | 1/2007  | Chen et al. ............ | 714/724 |
| 7,219,314 | B1 | * | 5/2007  | Trimberger et al. ... | 716/4 |
| 7,340,705 | B1 | * | 3/2008  | Massabki et al. ...... | 716/5 |
| 2004/0040005 | A1 | * | 2/2004 | Carison ................ | 716/8 |
| 2005/0018799 | A1 | * | 1/2005 | Boerstler et al. ...... | 375/360 |
| 2005/0172254 | A1 |   | 8/2005 | Watanabe et al.     |         |

FOREIGN PATENT DOCUMENTS

| GB | 2 404 445    | 2/2005  |
| JP | 3-185364     | 8/1991  |
| JP | 08-62296     | 3/1996  |
| JP | 11-174125    | 7/1999  |
| JP | 2000-356667  | 12/2000 |
| JP | 2001-319500  | 11/2001 |
| JP | 2000-147071  | 5/2005  |
| JP | 2005-216012  | 8/2005  |

OTHER PUBLICATIONS

Google (English Dictionary), http://www.google.com/dictionary?langpair=en%7Cen&q=ASIC&hl=en&aq=f, p. 2 of 2, Website accessed on Feb. 24, 2009.*
Great Britain Search Report dated May 26, 2006 of Application No. GB0603432.6.
Japanese Office Action dated Sep. 29, 2009 in corresponding Japanese Patent Application No. 2005-322336.

* cited by examiner

*Primary Examiner*—Cynthia Britt
(74) *Attorney, Agent, or Firm*—Staas & Halsey LLP

(57) ABSTRACT

A first FF outputs a first signal. A second FF captures the first signal and outputs a second signal. Each of the first and the second FF has a clock terminal to capture a clock signal. A third FF captures the first signal in parallel with the second FF. The third FF has a clock terminal to capture the clock signal in parallel with the clock terminal of the second FF. A buffer delays arrival of the clock signal to the clock terminal of the third FF. A comparing circuit compares the second signal and the third signal. An error collecting circuit captures a result of comparison to judge whether a timing error occurs in the second FF.

6 Claims, 18 Drawing Sheets

FIG.2B
(a)
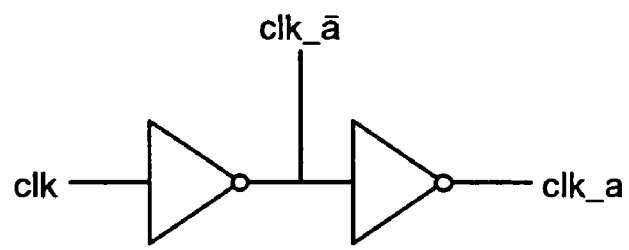
(b)
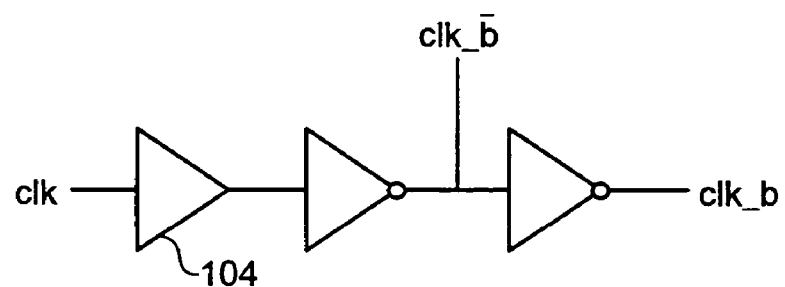

FIG.5B
(a)
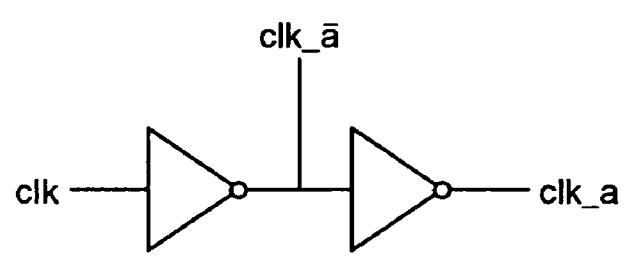
(b)
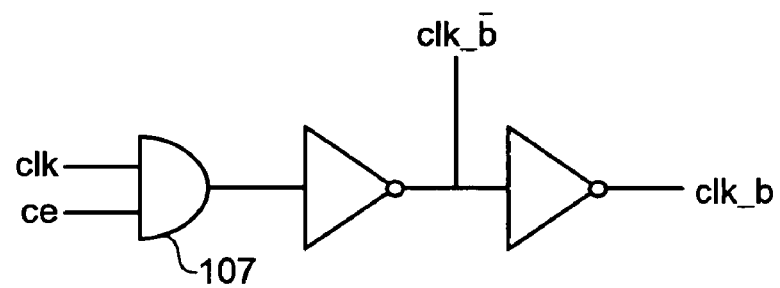

TEST CIRCUIT, METHOD AND APPARATUS FOR SUPPORTING CIRCUIT DESIGN, AND COMPUTER PRODUCT

CROSS-REFERENCE TO RELATED APPLICATIONS

This application is based upon and claims the benefit of priority from the prior Japanese Patent Application No. 2005-322336, filed on Nov. 7, 2005, the entire contents of which are incorporated herein by reference.

BACKGROUND OF THE INVENTION

1. Field of the Invention

The present invention relates to a technology test circuit, a semiconductor integrated circuit, and a method and apparatus for supporting design of a circuit.

2. Description of the Related Art

Conventionally, before shipment of a semiconductor integrated circuit, a test is performed to check whether the circuit operates correctly. The test generally includes the following:

(1) A function test for checking basic functional operation of the semiconductor integrated circuit.

(2) A logic test for detecting a failure at a transistor level in the semiconductor integrated circuit.

(3) A delay test for checking whether the semiconductor integrated circuit operates at a target frequency.

Along with miniaturization of technology, fluctuations in delay are increased due to variations in the process, reduction of a power supply voltage, and cross talks. Since such delay fluctuations cannot be estimated qualitatively at the time of design, the delay fluctuations are handled as uncertain delay. Therefore, a margin for the delay should be provided at the time of design.

Increase of the margin makes a timing design difficult. Therefore, a delay calculation technique using a statistical technique is increasingly employed to eliminate an unnecessary delay margin.

However, if the delay margin is reduced, all the manufactured circuits may not operate at a target frequency. As a technique that screens such a timing failure circuit, an at-speed test must be performed, which performs a delay test at the timing of an actual device frequency. A technology for the at-speed test with a dedicated built-in circuit is disclosed in, for example, Japanese Patent Application Laid-Open Publication No. 2001-319500.

However, since the at-speed test is performed under a special condition called a test mode, which is different condition from a normal chip operating condition, the operation in the actual device is not necessarily assured even when it is successful in the at-speed test.

On the contrary, a chip normally operating in the actual device may not pass the at-speed test. The at-speed test is time-consuming. Moreover, the at-speed test requires a dedicated circuit called built-in-self-test (BIST) and an expensive device specially prepared for the at-speed test. Therefore, manufacturing cost increases.

SUMMARY OF THE INVENTION

It is an object of the present invention to at least solve the above problems in the conventional technology.

A test circuit according to one aspect of the present invention includes a first circuit element configured to capture a data signal output from a source circuit element in a semiconductor integrated circuit; a second circuit element configured to capture a data signal output from the source circuit element; a delay element configured to delay operation timing of the second circuit element compared to operation timing of the first circuit element; a comparing circuit configured to compare a value of the data signal captured by the first circuit element with a value of the data signal captured by the second circuit element; and a collecting circuit configured to collect a result of comparison by the comparing circuit.

A design support method according to another aspect of the present invention includes acquiring, from information on a semiconductor integrated circuit, information on a first circuit element configured to capture a data signal output from a source circuit element within the semiconductor integrated circuit; and replacing the information on the first circuit element with information on a test circuit that includes the first circuit element, a second circuit element configured to capture a data signal output from the source circuit element, a delay element configured to delay operation timing of the second circuit element compared to operation timing of the first circuit element, a comparing circuit configured to compare a value of the data signal captured by the first circuit element with a value of the data signal captured by the second circuit element, and a collecting circuit configured to collect a result of comparison by the comparing circuit.

A computer-readable recording medium according to still another aspect of the present invention stores therein a computer program for realizing a design support method according to the above aspect.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 2B is a schematic diagram of a test circuit shown in FIG. 1;

FIG. 5B is a schematic diagram of a test circuit shown in FIG. 4;

DETAILED DESCRIPTION OF THE PREFERRED EMBODIMENTS

Exemplary embodiments according to the present invention will be explained in detail with reference to the accompanying drawings.

Figure 1:
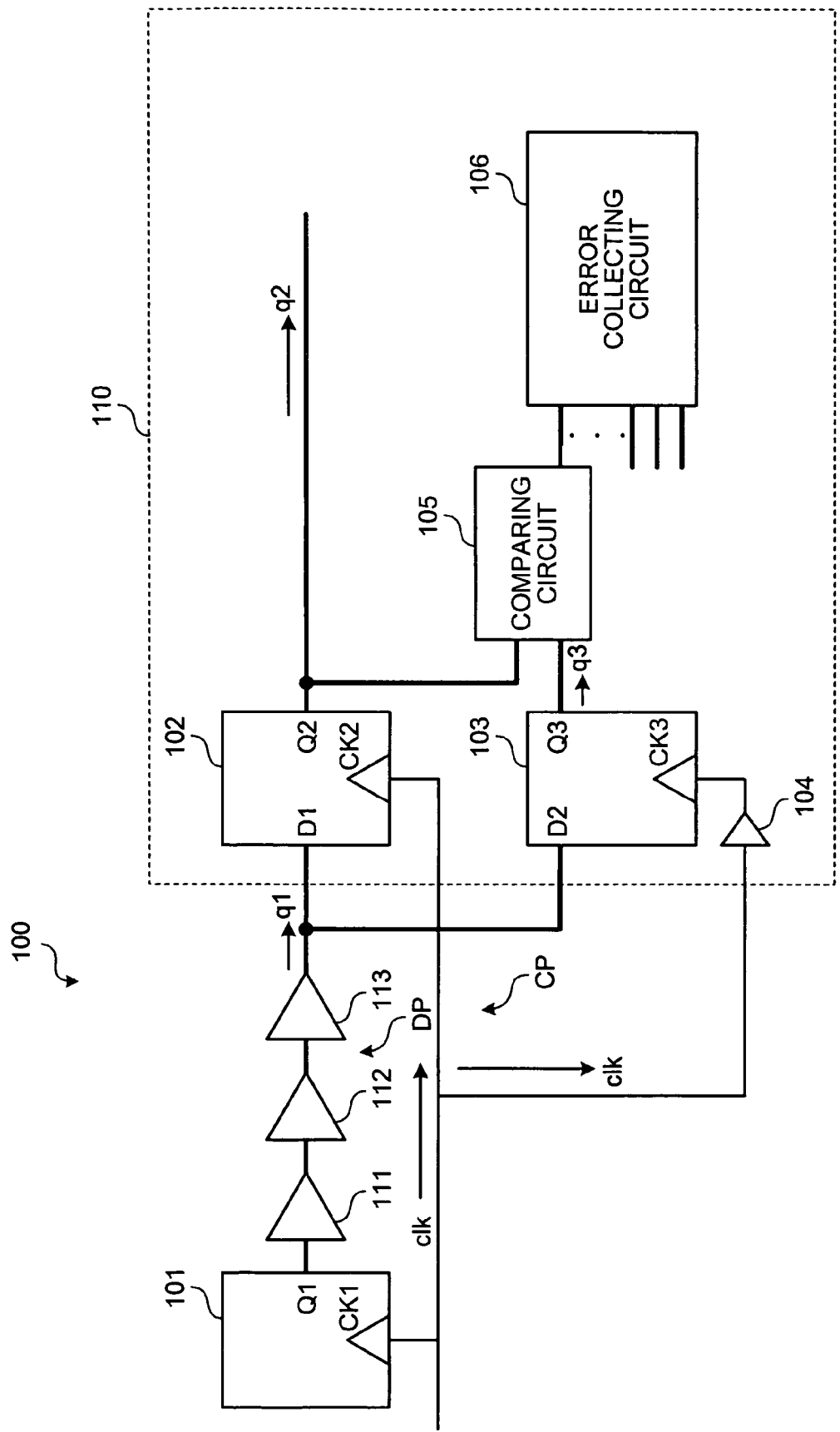
FIG. 1 is a circuit diagram of a semiconductor integrated circuit according to a first embodiment of the present invention.

FIG. 1 is a circuit diagram of a semiconductor integrated circuit according to a first embodiment of the present invention. In a semiconductor integrated circuit 100, a path indicated by a heavy line in FIG. 1 is a data path transmitting a data signal, and a path indicated by a thin line is a clock path transmitting a clock signal from a clock source.

As shown in FIG. 1, the semiconductor integrated circuit 100 has a flip-flop (hereinafter, "FF") 101 and a FF 102. The FF 101 and the FF102 are connected by a data path DP through buffers 111 to 113. The FF 101 outputs a data signal q1 from an output terminal Q1.

The FF 102 captures, at an input terminal D1, the data signal q1 output from the output terminal Q1 of the FF 101. When the data signal q1 is captured, the FF 102 outputs a data signal q2. The FF 101 and the FF102 has clock terminals CK1 and CK2 connected to a clock path CP, respectively, and capture a clock signal clk. In this way, the FF 101 and the FF102 operate at the same timing.

In the semiconductor integrated circuit 100, when a timing test in the data path is performed, a test circuit 110 is embedded instead of the FF102 where the data signal q1 output from the FF 101 is captured. The test circuit 110 is provided with a first output-destination circuit element (FF 102), a second output-destination circuit element (FF 103), a delay element, a comparing unit, and an error collecting unit.

The first output-destination circuit element is a circuit element where a data signal from an output-source circuit element of the data signal is captured. For example, in FIG. 1, when the output-source circuit element is the FF 101, the first output-destination circuit element corresponds to the FF 102 where the data signal q1 output from the FF 101 is captured.

The second output-destination circuit element is a circuit element capturing a data signal from the output-source circuit element. For example, in an example shown in FIG. 1, when the output-source circuit element is the FF 101, the second output-destination circuit element corresponds to the FF 103 capturing the data signal q1 output from the FF 101, along with the FF 102.

The FF103 is a FF with the same configuration as the FF 102 and captures, at an input terminal D2, the data signal output from the FF101 in parallel with the FF 102. The FF 103 has a clock terminal CK3 and captures the clock signal clk in parallel with the clock terminal CK2 of the FF 102.

The delay element is a circuit element that delays the operation timing of the second output-destination circuit element compared to the operation timing of the first output-destination circuit element. For example, in the example shown in FIG. 1, when the output-source circuit element is the FF 101; the first output-destination circuit element is the FF 102; and the second output-destination circuit element is the FF 103, the delay element corresponds to a buffer 104 at a stage before the clock terminal CK3 of the FF 103. The buffer 104 is provided on the clock path CP and delays the arrival of the clock signal clk to the clock terminal CK3.

By providing the delay element (buffer 104), the timing of capturing the data signal q1 from the FF 101 at the input terminal D2 of the FF 103 can have a larger margin than the timing of capturing the data signal q1 at the input terminal D1 of the FF 102.

The comparing unit compares a value of the data signal captured by the first output-destination circuit element with a value of the data signal captured by the second output-destination circuit element. Specifically, for example, in the example shown in FIG. 1, the comparing unit is a comparing circuit 105 connected to the output terminal Q2 and the output terminal Q3. The comparing circuit 105 captures and compares the value of the data signal q2 and the value of the data signal q3. The comparison is performed with exclusive OR.

The error collecting unit collects a result of the comparison by the comparing circuit 105. For example, the error collecting unit is an error collecting circuit 106 connected to the comparing circuit 105 and captures the result of comparison of the value of the data signal q2 and the value of the data signal q3. Based on the result, it is determined whether a timing error is generated in the FF 102 or not.

Figure 2A:
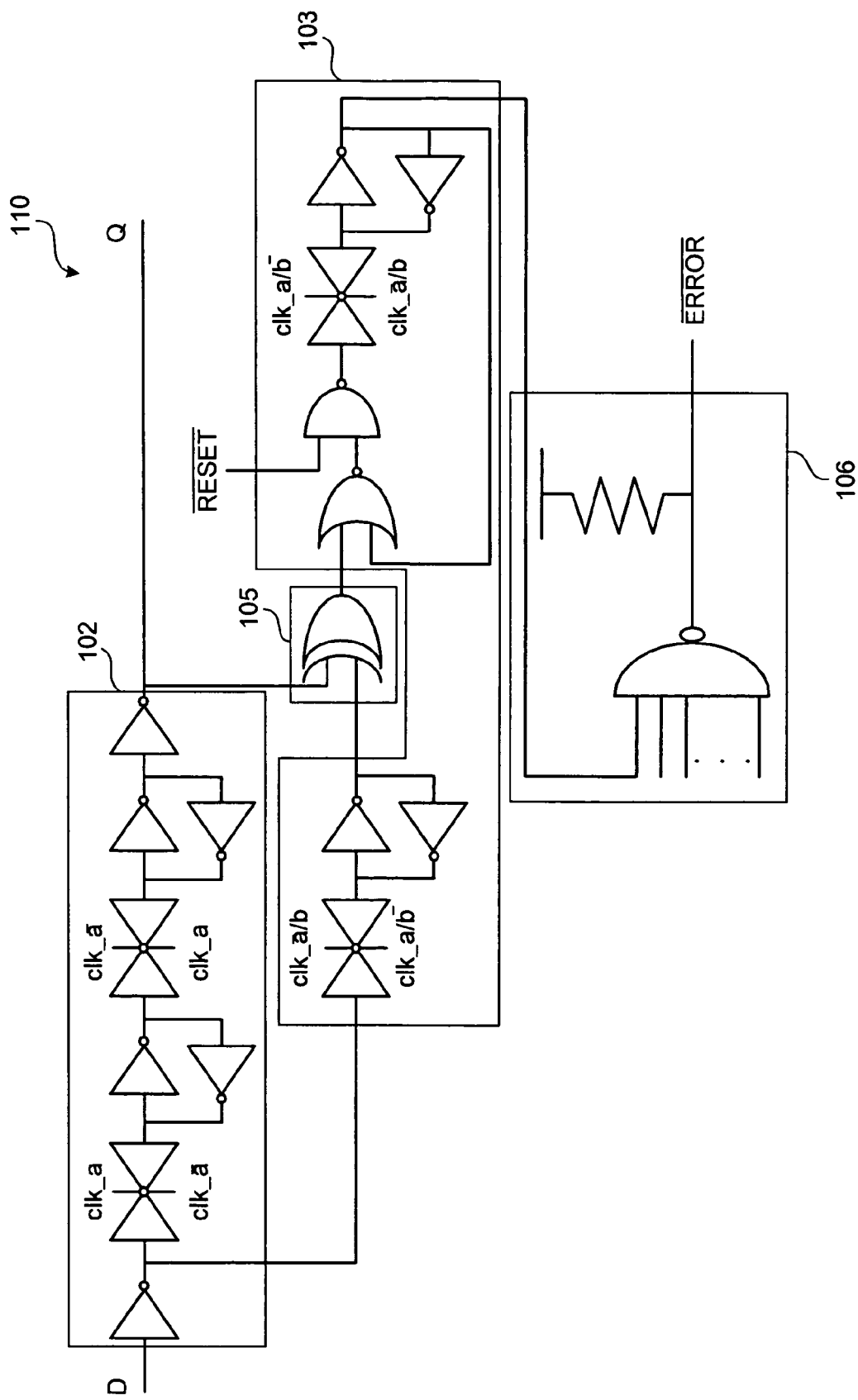
FIG. 2A is a schematic diagram of a test circuit shown in FIG. 1.

FIGS. 2A and 2B are schematic diagrams of the test circuit 110. FIG. 2A shows a circuit configuration except the clock path CP. A path (a) shown in FIG. 2B is the clock path CP to the FF 102 and a path (b) shown in FIG. 2B is the clock path CP to the FF 103.

Figure 3:
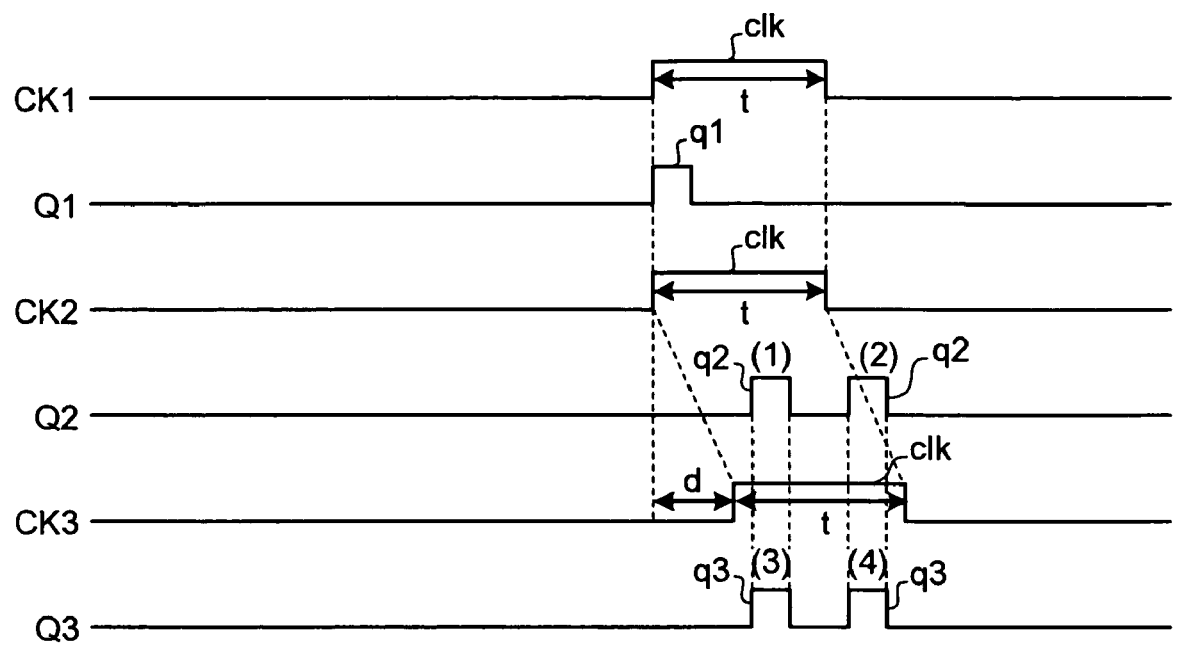
FIG. 3 is a timing chart of the semiconductor integrated circuit.

FIG. 3 is a timing chart of the semiconductor integrated circuit 100. When the clock signal clk is captured at the clock terminal CK1, the FF 101 outputs the data signal q1 from the output terminal Q1. At a similar timing, when the clock signal clk is captured at the clock terminal CK2, the FF 102 captures, at the input terminal D1, the data signal q1 and outputs the data signal q2.

On the other hand, the FF 103 captures, at the clock terminal CK3, the clock signal clk delayed by the delay element for time d from the input timing of the clock signal at the clock terminals CK1 and CK2. When capturing, at the input terminal D2, the data signal q1 from the DD101, the FF 103 outputs the data signal q3.

If the data signal q1 is captured, and the data signal q2 is output within the operation time t of the FF 102 (FIG. 3, (1)), the FF 103 also captures the data signal q1 and outputs the data signal q3 within the operation time t (FIG. 3, (3)). In this case, since the data path DP complies with the timing constraint, a problem does not occur.

On the other hand, if the data signal q1 is captured, and the data signal q2 is output after the operation time t of the FF 102 (FIG. 3, (2)), the data path DP violates the timing constraint. In the FF 103, the data signal q1 is captured and the data signal q3 is output within the operation time t (FIG. 3, (4)).

Therefore, since the data signal q2 from the output terminal Q2 is different in (1) and (2) while the data signal q3 from the output terminal Q3 is not changed in (3) and (4), the timing constraint violation (error) of the data path DP can be detected from the exclusive OR of the comparing circuit 105.

According to the embodiment 1, by adjusting the delay time t to a time appropriate for the actual operating environment, and by embedding the test circuit 110 to perform the test, it is possible to detect whether the data path DP with tight timing complies with or violates the timing constraint in the actual operating environment.

While in the first embodiment, a case in which the buffer 104 is used as the delay element at the stage before the clock terminal CK3 of the FF 103 of the test circuit 110 has been explained, in a second embodiment of the present invention, a gating circuit is used as the delay element, instead of the buffer 104.

Figure 4:
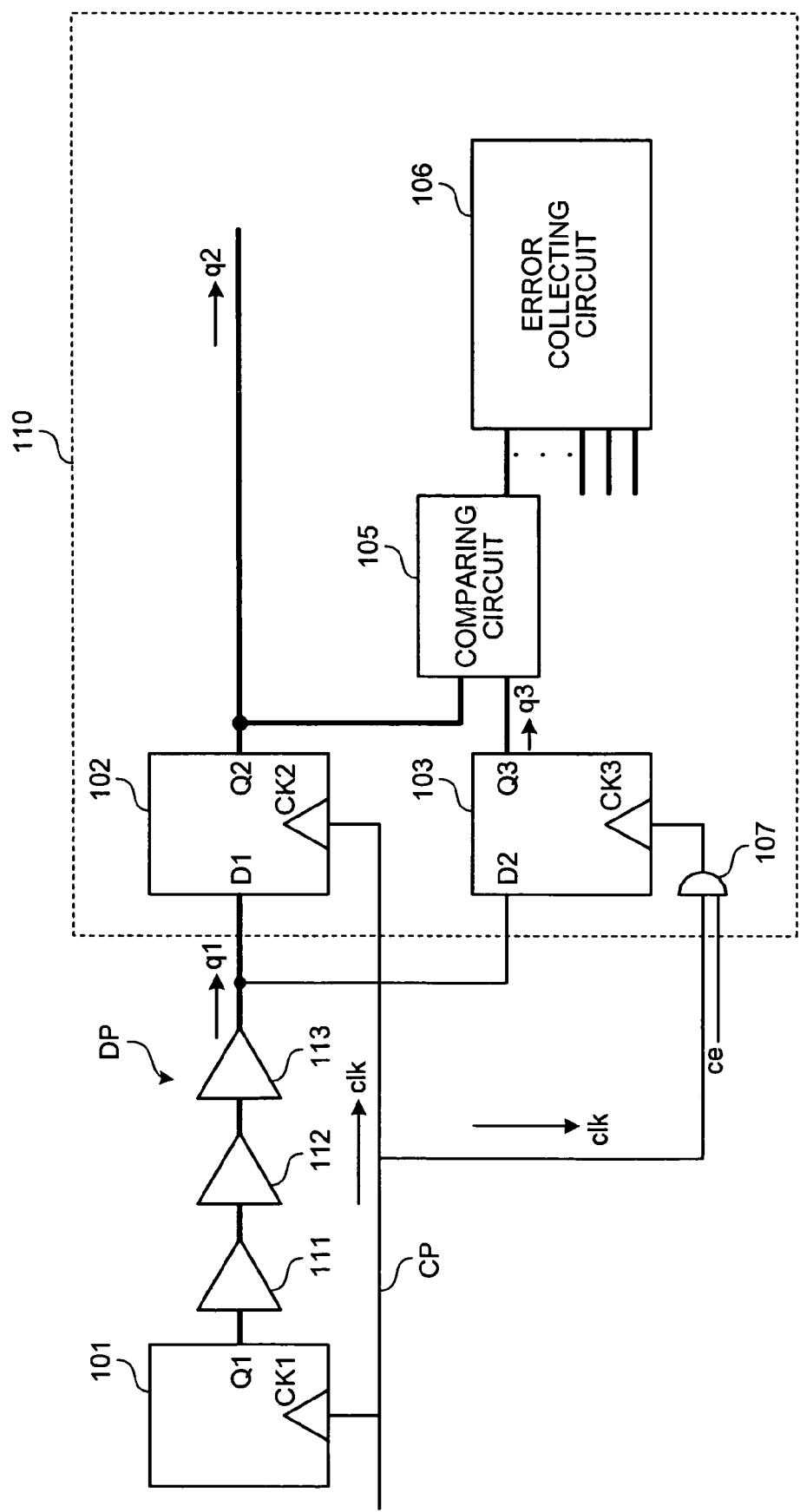
FIG. 4 is a circuit diagram of a semiconductor integrated circuit according to a second embodiment of the present invention.
Figure 5A:
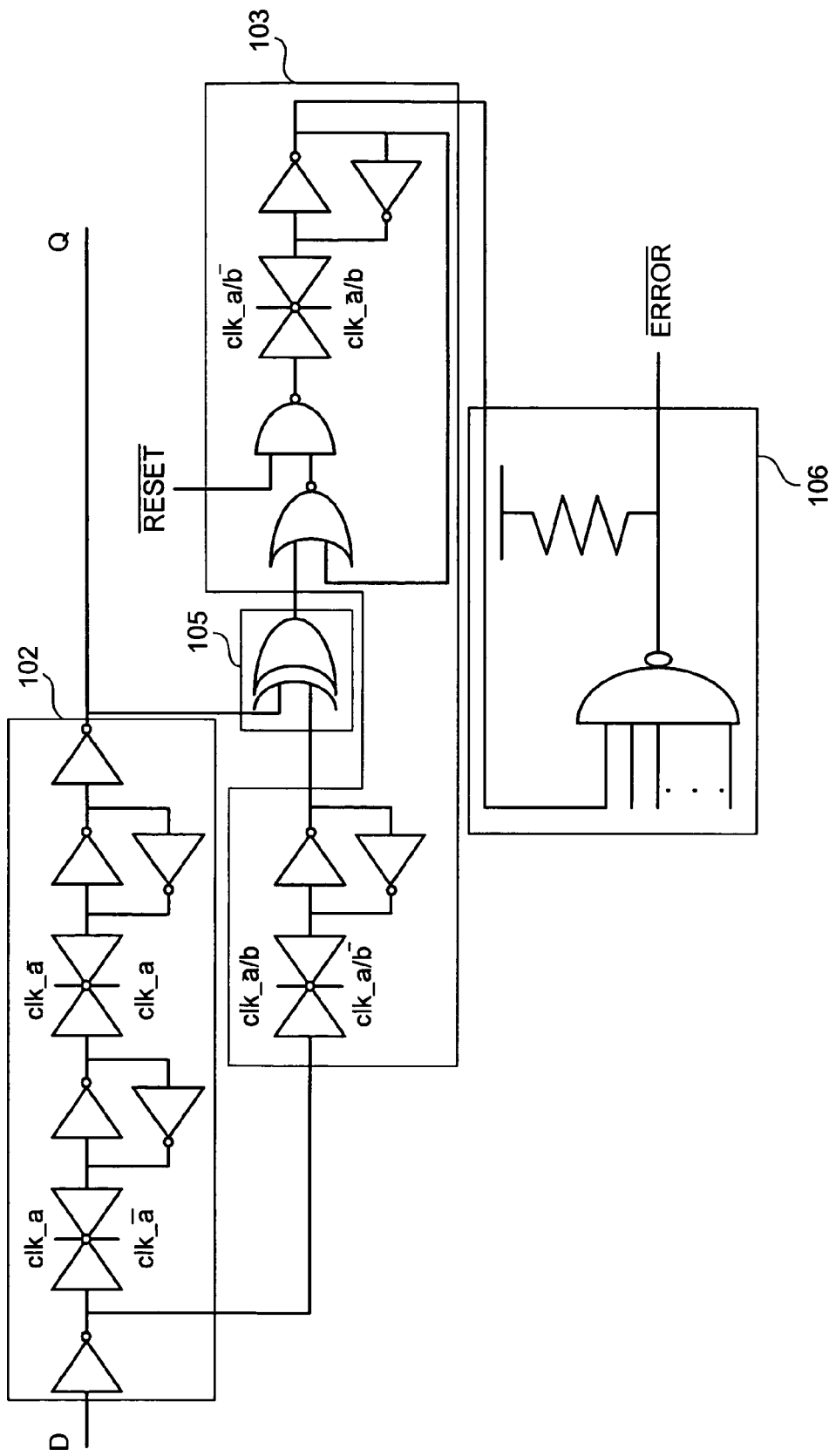
FIG. 5A is a schematic diagram of a test circuit shown in FIG. 4.

FIG. 4 is a circuit diagram of a semiconductor integrated circuit according to the second embodiment, and FIGS. 5A and 5B are schematic diagrams of the test circuit 110 shown in FIG. 4. FIG. 5A shows a circuit configuration except the clock path CP. A path (a) shown in FIG. 5B is the clock path CP to the FF 102, and a path (b) shown in FIG. 5B is the clock path CP to the FF 103.

A gating circuit 107 is a two-input AND circuit inputting, for example, the clock signal clk and a clock enable signal ce, and supplies the clock signal clk to the clock terminal CK3 only when the clock enable signal is input. By supplying the clock enable signal only when a user performs the test, power consumption can be controlled.

While in the first and the second embodiments, a case in which the test circuit is embedded to the semiconductor integrated circuit 100 has been explained, in a third embodiment of the present invention, a test is performed with a software-design supporting tool at a design stage before manufacturing the semiconductor integrated circuit 100. The test can be performed in the state appropriate for the actual operating environment of the actual device before manufacturing, and the quality of the semiconductor integrated circuit 100 can be improved.

Figure 6:
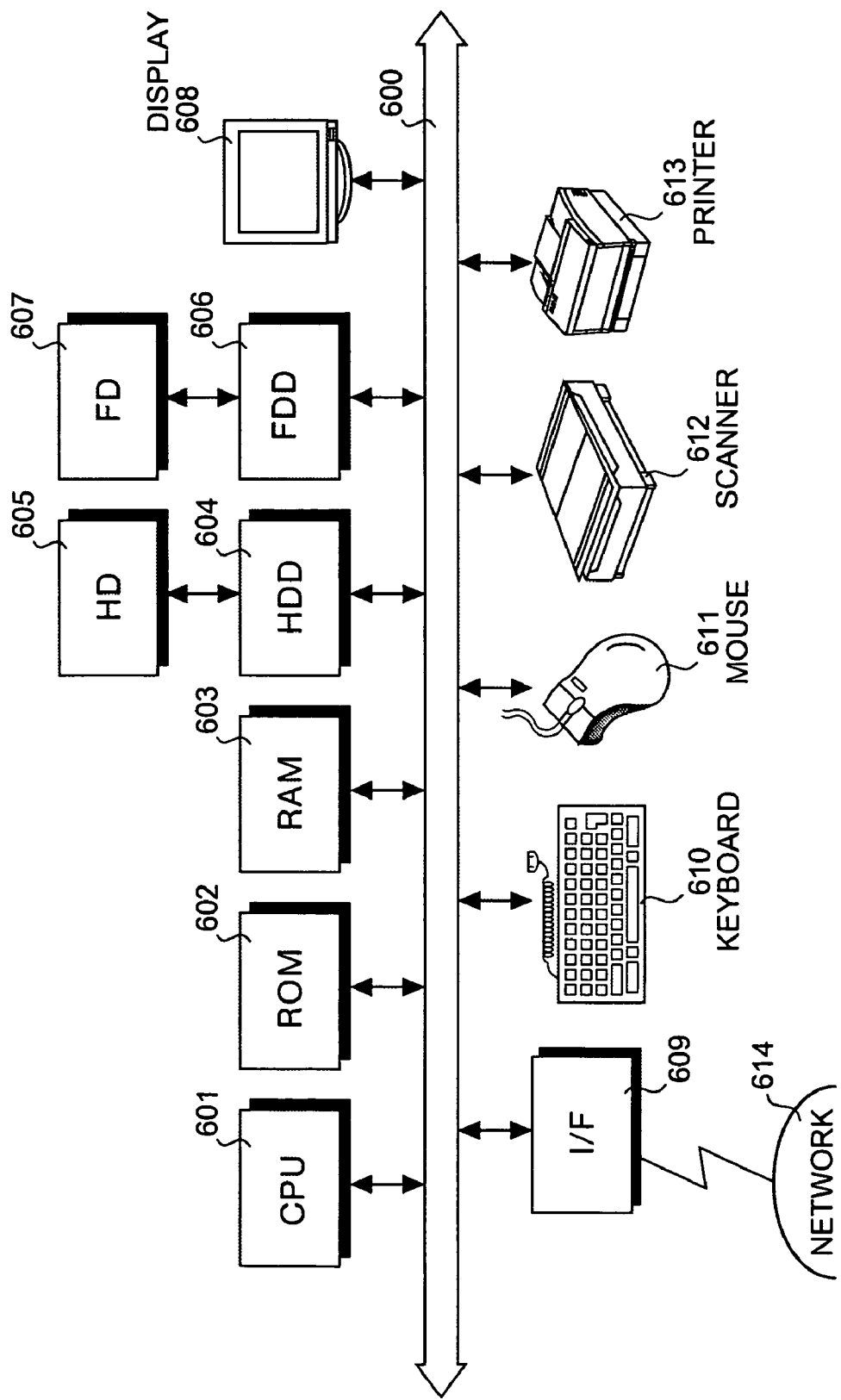
FIG. 6 is a schematic diagram of a design support apparatus according to a third embodiment of the present invention.

FIG. 6 is a block diagram showing the hardware configuration of the design support apparatus according to the third embodiment of the present invention. This design support apparatus is a computer apparatus is implemented with a computer in which the software-design supporting tool.

As shown in FIG. 6, the design support apparatus includes a central processing unit (CPU) 601, a read-only memory (ROM) 602, a random-access memory (RAM) 603, a had disk (HDD) 604, a hard disk (HD) 605, a flexible disk drive (FDD) 606, a flexible disk (FD) 607 as an example of a removable recording medium, a display 608, an interface (I/F) 609, a keyboard 610, a mouse 611, a scanner 612, and a printer 613. Each of the components is connected with a bus 600.

The CPU 601 controls the design support apparatus. The ROM 602 stores programs such as a boot program. The RAM 603 is used as a work area of the CPU 601. The HDD 604 controls read/write of data from/to the HD 605 under the control of the CPU 601. The HD 605 stores data written in accordance with a control of the HDD 604.

The FDD 606 controls read/write of data from/to the FD 607 in accordance with a control of the CPU 601. The FD 607 stores data written in accordance with a control of the FDD 606 and allows the design support apparatus to read the data stored in the FD 607.

As a removable recording medium, in addition to the FD 607, a compact-disk read-only memory (CD-ROM), a compact-disk recordable (CD-R), a compact-disk rewritable CD-RW), a magneto optical (MO) disk, a digital versatile disk (DVD), and a memory card may be used. The display 608 displays a cursor, icons, and tool boxes as well as data such as a document, an image, and function information. As the display 608, for example, a cathode ray tube (CRT), a thin film transistor (TFT) liquid crystal display (LCD), and a plasma display can be employed.

The I/F 609 is connected via a communication line to network 614 such as the internet and is connected to external apparatuses via the network 614. The I/F 609 is responsible for interfacing the network 614 with the inside of the apparatus and controls input/output of data from/to an external apparatus. As the I/F 609, a modem or a local area network (LAN) adaptor can be employed.

The keyboard 610 is provided with keys for entering characters, numerals, and various instructions to enter data. A touch-panel input pad, and a numeric keypad may be used instead. The mouse 611 moves a cursor, selects an area or moves and resizes a window. A trackball or a joystick may be used instead, as long as similar functions are provided as a pointing device.

The scanner 612 reads an image optically and captures image data into the design support apparatus. The scanner 612 may have an optical character reader (OCR) function. The printer 613 prints image data and document data. As the printer 613, a laser printer or ink-jet printer may be employed.

Figure 7:
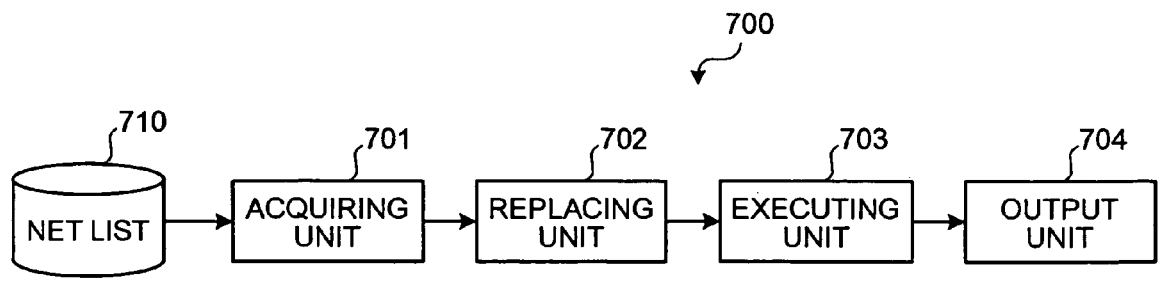
FIG. 7 is a block diagram of the design support apparatus.

FIG. 7 is a block diagram of the design support apparatus according to the third embodiment. As shown in FIG. 7, a design support apparatus 700 includes a net list 710, an acquiring unit 701, a replacing unit 702, an executing unit 703, and an output unit 704.

The net list 710 is of the semiconductor integrated circuit 100 to be tested. For example, the net list 710 describes the circuits of the semiconductor integrated circuit 100 shown in FIG. 1, except the FF 103, the comparing circuit 105, and the error collecting circuit 106.

The acquiring unit 701 acquires information on the first output-destination circuit element capturing the data signal from the output-source circuit element in the semiconductor integrated circuit 100. The output-source circuit element corresponds to the FF 101 shown in FIG. 1, for example, and the first output-destination circuit element corresponds to the FF 102 shown in FIG. 1, for example.

The information on the first output-destination circuit element is descriptive data identifying the FF 102 in the net list 710. When the acquiring unit 701 reads the net list 710 and a user specifies the FF 102 of the data path DP that is believed to have a tight timing, the acquiring unit 701 acquires the descriptive data identifying the FF 102.

The replacing unit 702 replaces the information on the first output-destination circuit element (FF 102) with information on the test circuit 110. The information on the test circuit 110 is descriptive data of the circuits constituting the test circuit 110 (test circuit descriptive data) and replaces the descriptive data identifying the FF 102.

The executing unit 703 reads the net list 710 of the semiconductor integrated circuit 100 after replaced by the test circuit 110 to execute a predetermined test. The output unit 704 outputs a test result of the executing unit 703.

Specifically, the functions of the acquiring unit 701, the replacing unit 702, the executing unit 703, and the output unit 704 described above are achieved by the CPU 601 executing the programs recorded on a recording medium such as the ROM 602, the RAM 603, the HD 605 shown in FIG. 6, for example, or by the I/F 609.

Figure 8A:
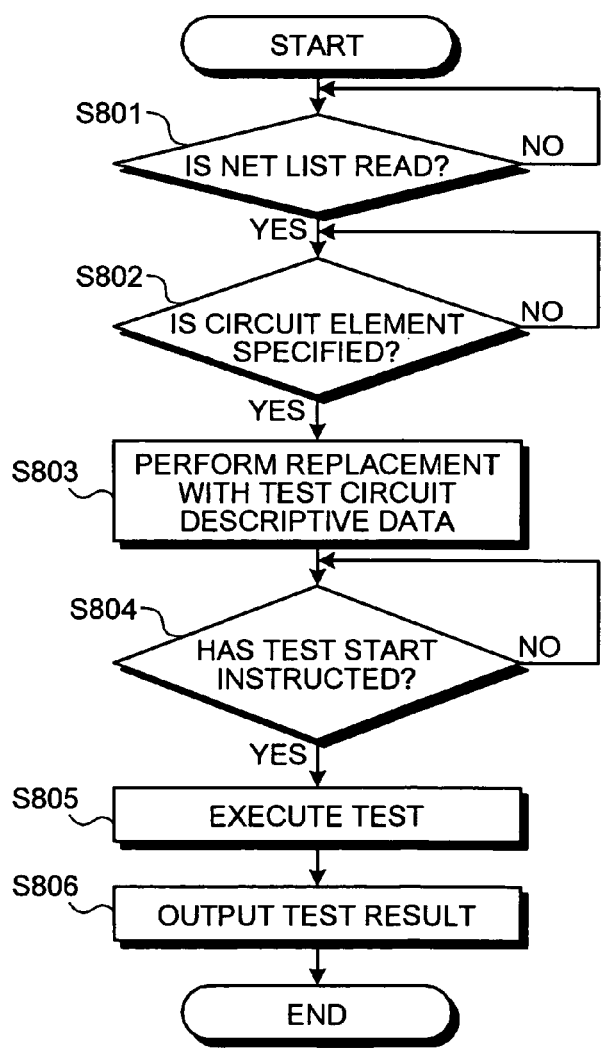
FIG. 8A is a flowchart of a design support processing by the design support apparatus according to the third embodiment.

FIG. 8A is a flowchart of a design support processing by the design support apparatus 700. The acquiring unit 701 waits until the net list 710 is read (step S801: NO) and if the net list 710 is read (step S801: YES), the acquiring unit 701 waits until the circuit element (e.g., FF 102) of the semiconductor integrated circuit 100 is specified (step S802: NO). If the circuit element is specified (step S802: YES), the descriptive data of the FF 102 are replaced by the test circuit descriptive data (step S803).

After waiting for an instruction to start test (test start instruction) to be input (step S804: NO), when the test start instruction is input (step S804: YES), the executing unit 703 executes a test using the replaced net list 710 (step S805). The output unit 704 outputs a test result (step S806).

According to the third embodiment, since the test can be executed using the net list 710 after replacing the FF specified by a user with the test circuit 110, the test can be performed in the state appropriate for the actual operating environment of the actual device at the design stage and the quality of the semiconductor integrated circuit 100 can be improved.

Although the descriptive data of the FF 102 are acquired from the net list 710 by the user specifying the circuit element (e.g., FF 102) in the acquiring unit 701 described above, the descriptive data of the FF 102 may be automatically acquired from the timing analysis result about the semiconductor integrated circuit 100.

Since in the timing analysis result, information of the critical path violating the timing constraint is listed, by detecting the circuit element (e.g., FF 102) at the receiving end of the critical path, the circuit element to be tested can be automatically detected, which is replaced with the test circuit descriptive data.

Figure 8B:
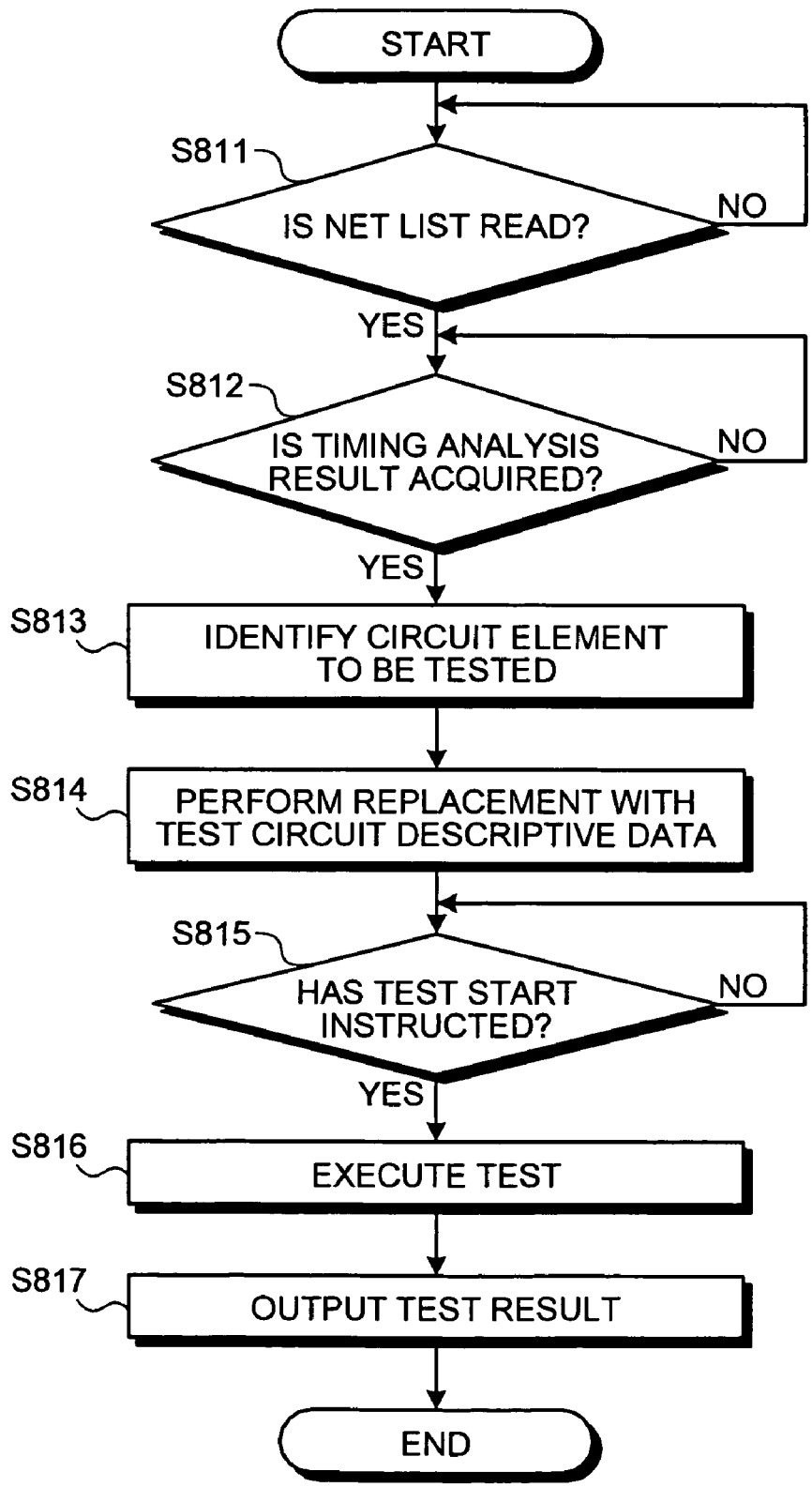
FIG. 8B is a flowchart of another design support processing by the design support apparatus according to the third embodiment.

FIG. 8B is a flowchart of another procedure of the design support processing by the design support apparatus 700. The acquiring unit 701 waits until the net list 710 is read (step S811: NO), and when the net list 710 is read (step S811: YES), it is determined whether the timing analysis result of the semiconductor integrated circuit 100 is acquired (step S812).

If the timing analysis result is not acquired, the acquisition is waited (step S812: NO). On the other hand, when the timing analysis result is acquired (step S812: YES), the circuit element (e.g., FF 102) to be tested is identified (step S813). The descriptive data of the identified circuit element (FF 102) are replaced by the test circuit descriptive data (step S814).

The test starting input is waited (step S815: NO), and if the test starting input exists (step S815: YES), the executing unit 703 executes a test using the replaced net list 710 (step S816). The output unit 704 outputs a test result (Step S817). According to the design support processing procedure, since the automatic detection can be performed for the FF at the receiving end of the path with tight timing constraint, the efficiency of the test can be enhanced.

Figure 9:
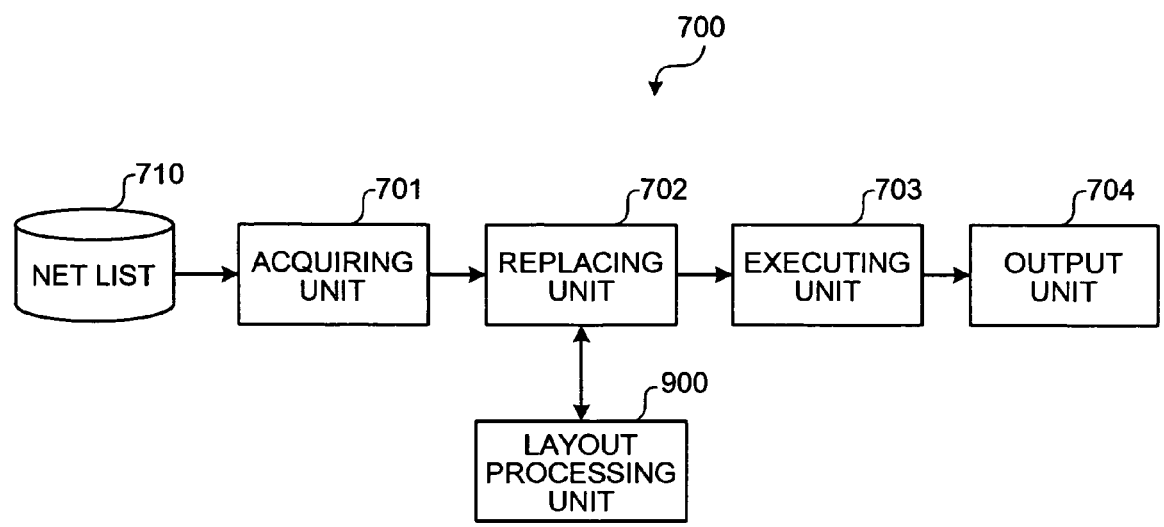
FIG. 9 is a block diagram of a design support apparatus according to a fourth embodiment of the present invention.

A fourth embodiment of the present invention is an example of layout processing when replacement with the test circuit descriptive data is performed. FIG. 9 is a block diagram of a design support apparatus according to the fourth embodiment. FIG. 9 is constituted by adding a layout processing unit 900 to the configuration (numerals 701 to 704) of the third embodiment shown in FIG. 7.

Figure 10:
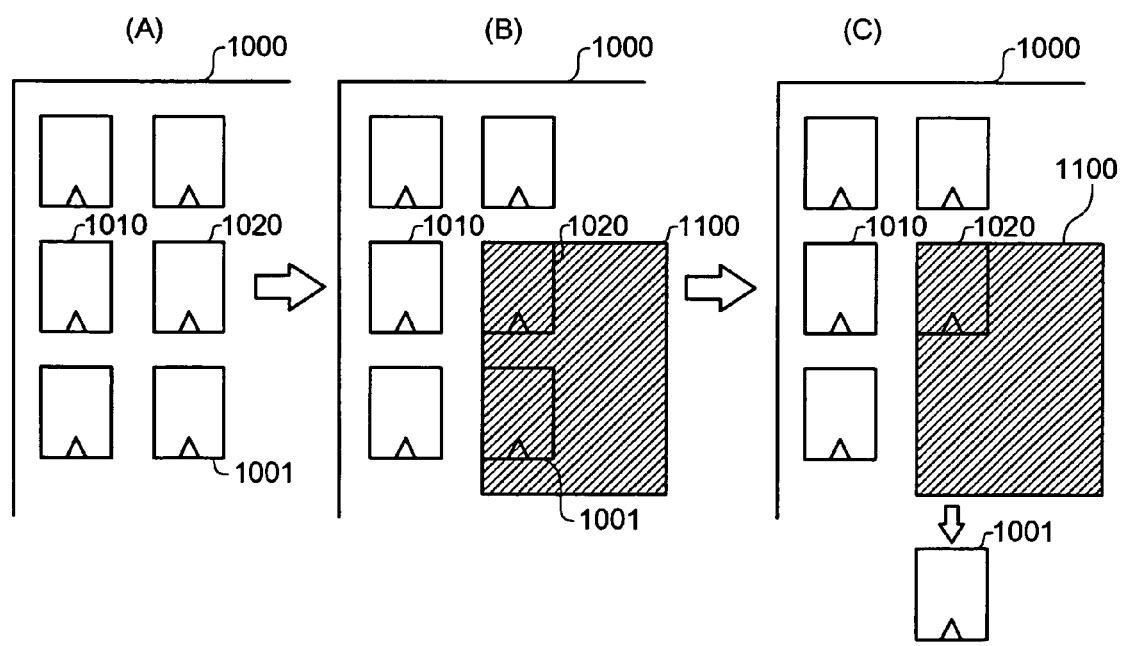
FIG. 10 is a schematic diagram for illustrating a layout processing by a layout processing unit shown in FIG. 9.

The layout processing unit 900 executes processing that changes layout arranged and wired. FIG. 10 is a schematic diagram for illustrating the layout processing by the layout processing unit 900. A layout (A) shown in FIG. 10 illustrates a layout before replacing with the test circuit descriptive data; a layout (B) shown in FIG. 10 illustrates a layout after replacing with the test circuit descriptive data; and a layout (C) illustrates a layout after a change is made.

As shown in the layout (A), layout data 1000 of the semiconductor integrated circuit 100 shown in FIG. 1 includes layout data 1010 of the FF 101 and layout data 1020 of the FF 102. Layout data 1001 is of another FF (not shown in FIG. 1) disposed in the vicinity of the FF 102 shown in FIG. 1.

When the replacing unit 702 replaces the descriptive data of the FF 102 with the descriptive data of the test circuit 110 (test circuit descriptive data), the layout processing unit 900 creates the layout (B). In the layout (B), layout data 1100 is of the test circuit 110 shown in FIG. 1. When the FF 102 is replaced with the test circuit 110, the layout data 1100 overlaps with the layout data 1001 of the FF. Therefore, as shown in the layout (C), the position of the overlapping layout data 1001 is changed so as not to overlap with the layout data 1100.

Figure 11:
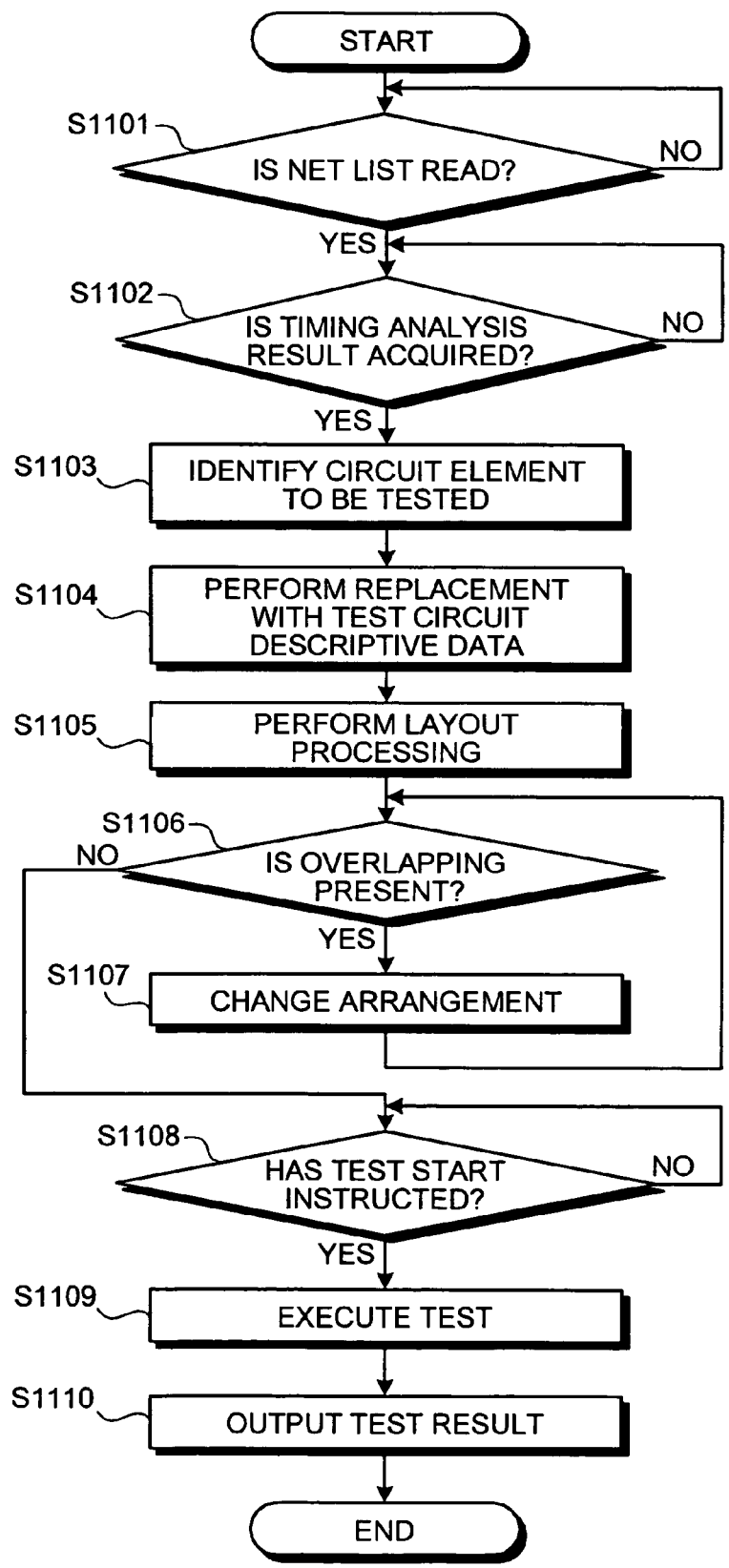
FIG. 11 is a flowchart of a design support processing by the design support apparatus according to the fourth embodiment.

FIG. 11 is a flowchart of a design support processing by the design support apparatus 700 according to the fourth embodiment.

The acquiring unit 701 waits until the net list 710 of the semiconductor integrated circuit 100 is read (step S1101: NO) and when the net list 710 is read (step S1101: YES), it is determined whether the timing analysis result of the semiconductor integrated circuit 100 is acquired (step S1102).

If the timing analysis result is not acquired, the acquisition is waited (step S1102: NO). On the other hand, when the timing analysis result is acquired (step S1102: YES), the circuit element (e.g., FF 102) to be tested is identified (step S1103). The descriptive data of the identified circuit element (FF 102) are replaced by the test circuit descriptive data (step S1104).

The layout processing unit 900 executes the layout processing after the replacement as shown in the layout (B) in FIG. 10 is created from the layout (A) (step S1105). It is determined whether the layout data 1100 of the test circuit 110 overlap with the layout data 1001 of another FF (step S1106). If the layout data do not overlap (step S1106: NO), the procedure proceeds to step S1108.

On the other hand, if the layout data overlap (step S1106: YES), the layout data 1001 are rearranged so as not to overlap with the layout data 1100 (step S1107). This rearrangement may be performed by user operation or automatically to an available area to the extent that a critical path is not generated. After the rearrangement, the procedure returns back to step S1106.

At step S1108, the test start instruction is waited to be input (step S1108: NO), and when the test start instruction is input (step S1105: YES), the executing unit 703 executes a test using the replaced net list 710 (step S1109). The output unit 704 outputs a test result (Step S1110). According to the design support processing, since the automatic detection can be performed for the FF at the receiving end of the path with tight timing constraint, the efficiency of the test can be enhanced.

According to the fourth embodiment, since the rearrangement can be performed for the layout data 1001 of the FF overlapping with the layout data 1100 of the test circuit 110, the test can be performed in the state appropriate for the actual operating environment of the actual device at the time of the layout processing or after the layout processing, and the quality of the semiconductor integrated circuit 100 can be improved.

A fifth embodiment of the present invention is an example of generating a test pattern in the third embodiment and the fourth embodiment. The test pattern is a collection of identification information of test programs necessary for the test of the semiconductor integrated circuit 100. By generating this test pattern, minimum applications required for the test can be identified, and reduction of the test period can be achieved. Since a configuration of the fifth embodiment is the same as that of the third embodiment (see FIG. 6), the description thereof is omitted.

Figure 12:
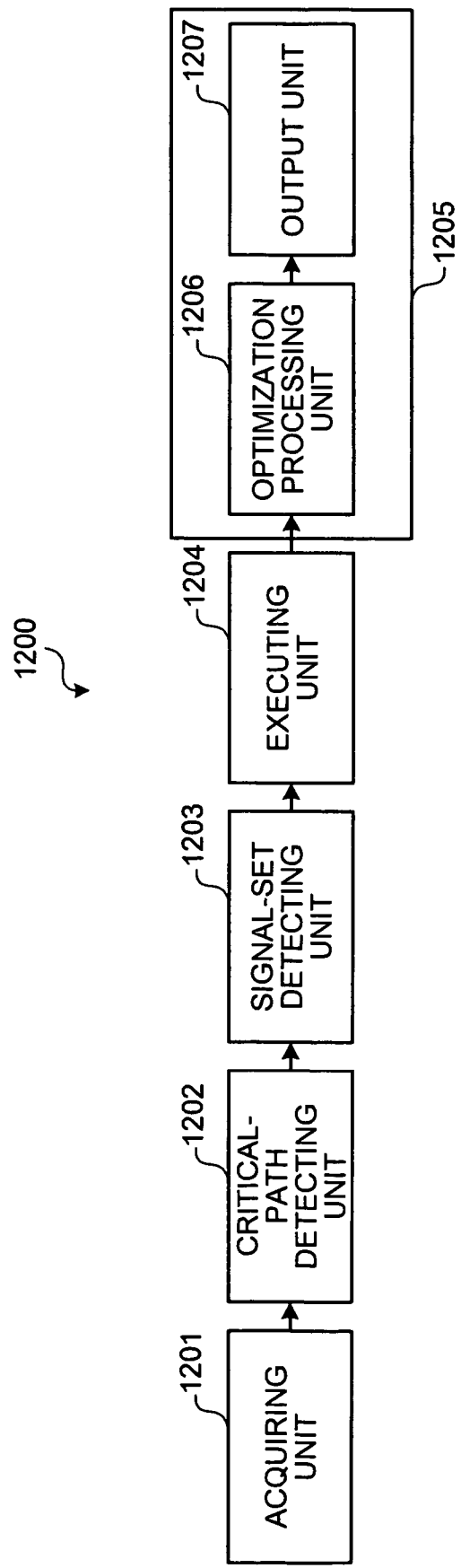
FIG. 12 is a block diagram of a design support apparatus according to a fifth embodiment of the present invention.

FIG. 12 is a block diagram of a design support apparatus according to the fifth embodiment. As shown in FIG. 12, a design support apparatus 1200 includes an acquiring unit 1201, a critical-path detecting unit 1202, a signal-set detecting unit 1203, an executing unit 1204, and a generating unit 1205. The acquiring unit 1201 acquires a timing analysis result of the semiconductor integrated circuit 100.

Figure 13:
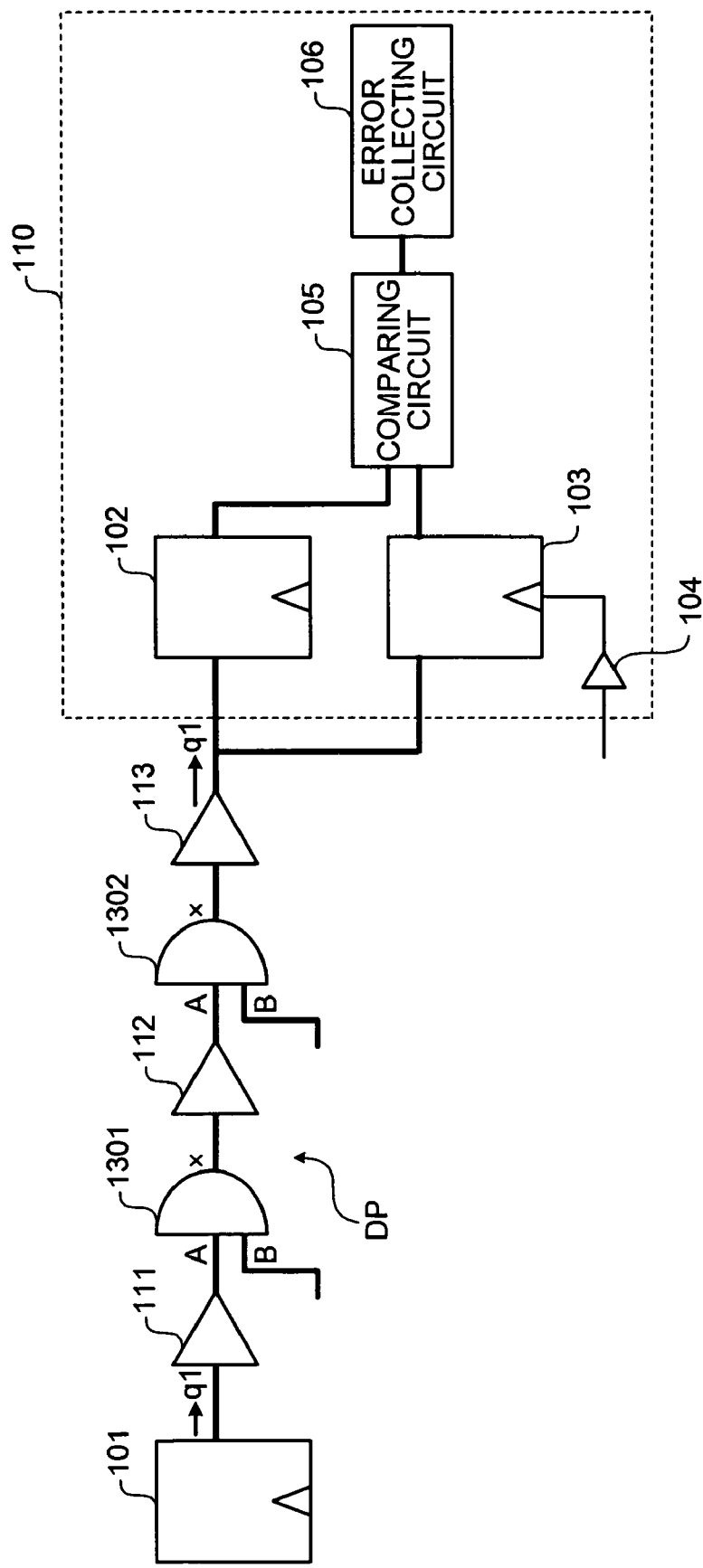
FIG. 13 is a circuit diagram of a semiconductor integrated circuit according to the fifth embodiment.

The critical-path detecting unit 1202 detects a critical path from the timing analysis result. The signal-set detecting unit 1203 detects signal sets for the critical path transmitting data signals. FIG. 13 is a circuit diagram of the semiconductor integrated circuit 100. Data path DP shown in FIG. 13 is the critical path detected by the critical-path detecting unit 1202.

An AND circuit 1301 is provided between a buffer 111 and a buffer 112 on the data path DP, and an AND circuit 1302 is provided between the buffer 112 and a buffer 113 on the data path DP.

The AND circuits 1301 and 1302 capture the data signal q1 at input terminals A, and output the data signal q1 from output terminals X. The outputs of the data signal q1 from the output terminals X are controlled based on presence of signals captured at input terminals B. As the condition of transmitting the data signal q1 from the FF 101 to the FF 102 on the data path DP, i.e., the critical path, both input terminals B of the AND circuits 1301 and 1302 are required to be "1". The signal values of the input terminals B of the AND circuits 1301 and 1302 are the signal set.

The executing unit 1204 reads the net list 710 of the semiconductor integrated circuit 100 after the replacement with the test circuit 110 to execute plural test programs. The executing unit 1204 stores identification information of the test program enabling the signal transmission to the test circuit 110.

The generating unit 1205 includes an optimization processing unit 1206 and an output unit 1207 and generates the test pattern. The optimization processing unit 1206 performs optimization processing with the use of the identification information of the test program enabling the signal transmission to the test circuit 110, which is obtained from the test by the executing unit 1204. In the optimization processing, the collection of the test programs and the collection of the signal sets are optimized as a bipartite graph issue.

Figure 14:
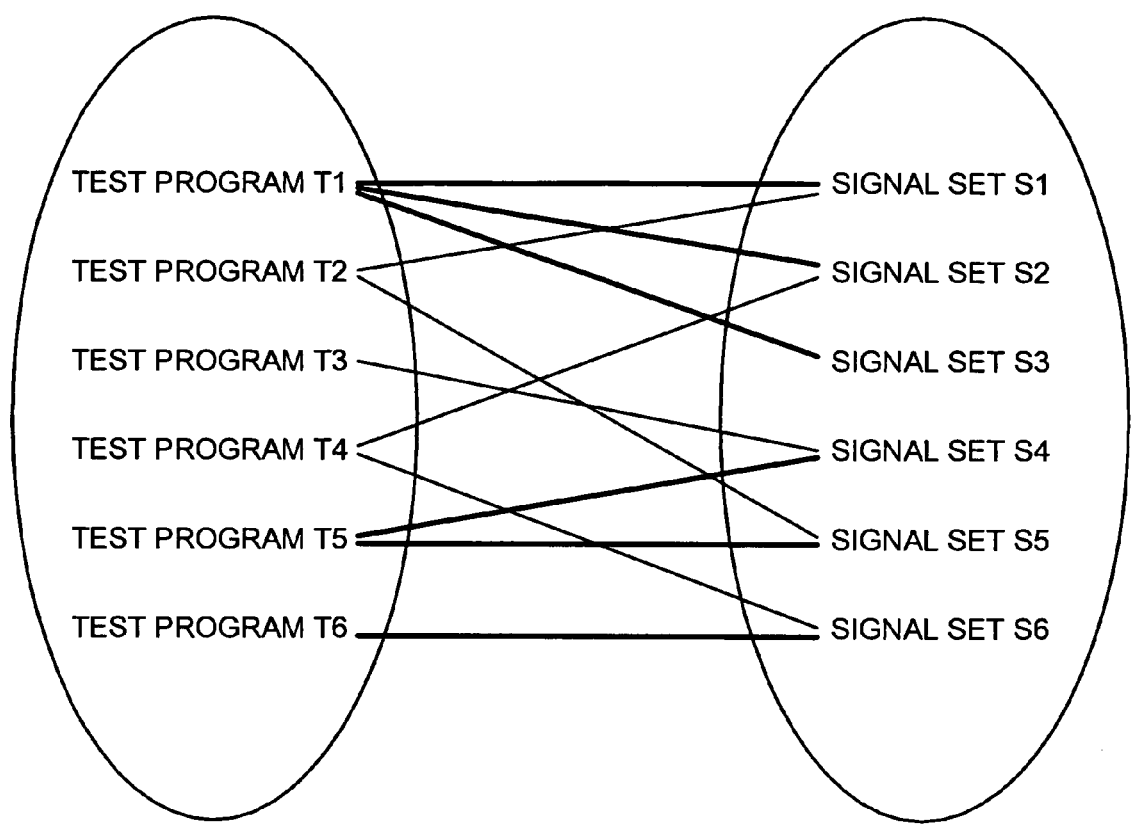
FIG. 14 is a schematic diagram of a bipartite graph.

FIG. 14 is a schematic diagram of a bipartite graph. The optimization is performed between the test programs T1 to T6 and the signal sets S1 to S6 as a bipartite graph issue. For example, the test program T1 enables the transmission to the corresponding test circuit 110 with each of the signal sets S1, S2, and S3.

The test program T2 enables the transmission to the corresponding test circuit 110 with each of the signal sets S1, S5. The test program T3 enables the transmission to the corresponding test circuit 110 with the signal sets S4. The test program T4 enables the transmission to the corresponding test circuit 110 with each of the signal sets S2 and S6. The test program T5 enables the transmission to the corresponding test circuit 110 with each of the signal sets S4 and S5. The test program T6 enables the transmission to the corresponding test circuit 110 with the signal sets S6.

As shown in the graph shown in FIG. 14, if only the test programs T1, T5, and T6 are executed, all the signal sets S1 to S6 are covered. The output unit 1207 outputs the identification information of these test programs T1, T5, and T6 as the test pattern.

Specifically, the functions of the acquiring unit 1201, the critical-path detecting unit 1202, the signal-set detecting unit 1203, the executing unit 1204, and the generating unit 1205 described above are achieved by the CPU 601 executing a program recorded on a recording medium such as the ROM 602, the RAM 603, the HD 605 shown in FIG. 6, for example, or by the I/F 609.

Figure 15:
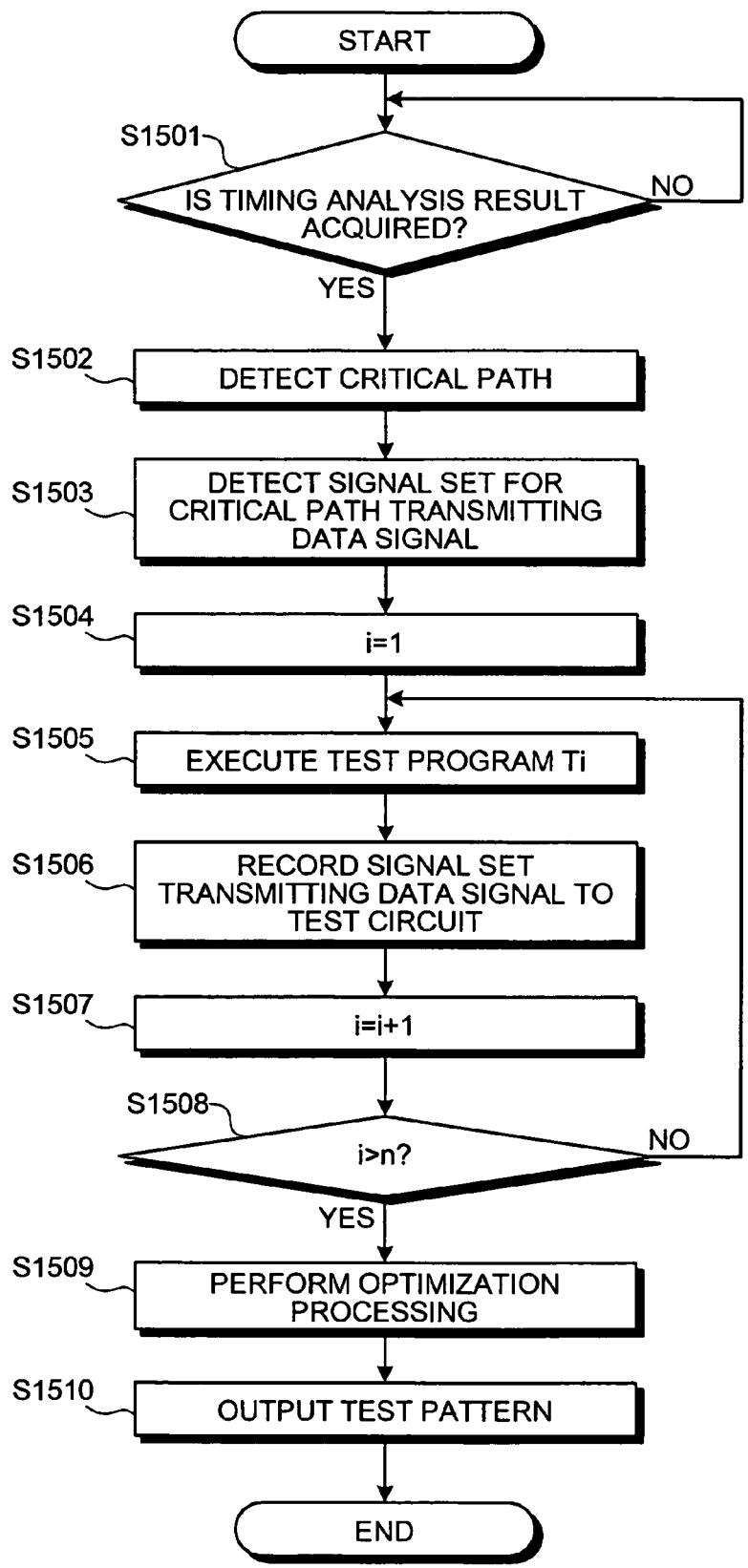
FIG. 15 is a flowchart of a design support processing by the design support apparatus according to the fifth embodiment.

FIG. 15 is a flowchart of a design support processing by the design support apparatus 1200. The timing analysis result of the semiconductor integrated circuit 100 is waited to be acquired (step S1501: NO), and when the timing analysis result is acquired (step S1501: YES), the critical-path detecting unit 1201 detects the critical path in the semiconductor integrated circuit 100 (step S1502).

The signal-set detecting unit 1203 detects the signal sets for the critical path transmitting data signals (step S1503). After assuming that i=1 (step S1504), a test program Ti is executed using the net list 710 of the semiconductor integrated circuit 100 after the replacement with the test circuit descriptive data (step S1505). The signal sets transmitting the data signal to the test circuit 110 are recorded (step S1506). After i is incremented (step S1507), it is determined whether i>n is satisfied (step S1508).

If i>n is not satisfied (step S1508: NO), the procedure returns back to step S1505. On the other hand, if i>n is satisfied (step S1508: YES), the optimization processing unit 1206 executes the optimization processing as shown in FIG. 14 (step S1509). The output unit 1207 outputs the result of the optimization processing, i.e., the test pattern (step S1510).

In the fifth embodiment, since the minimum requisite test programs T1, T5, and T6 can be identified, the test programs T2 to T4 are not needed to be executed in the actual test. In this way, the unnecessary applications for the test can be identified in advance and the reduction of the test time can be achieved.

A sixth embodiment of the present invention is an example of executing optimization processing of the voltage of the power supply in the third embodiment and the fourth embodiment. With this optimization processing, a voltage actually required can be confirmed. Since a configuration of the sixth embodiment is the same as that of the third embodiment (FIG. 6), the description thereof is omitted.

Figure 16:
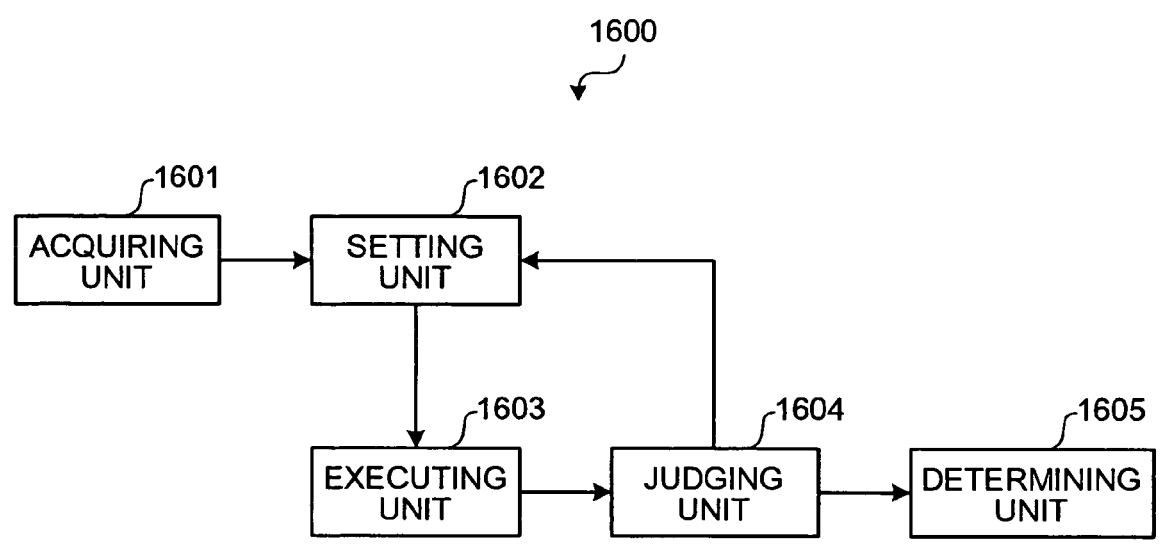
FIG. 16 is a block diagram of a design support apparatus according to a sixth embodiment of the present invention.

FIG. 16 is a block diagram of a design support apparatus according to the sixth embodiment. A design support apparatus 1600 includes an acquiring unit 1601, a setting unit 1602, an executing unit 1603, a judging unit 1604, and a determining unit 1605. The acquiring unit 1601 acquires the net list 710 of the semiconductor integrated circuit 100 after the replacement with the descriptive data of the test circuit 110 (test circuit descriptive data).

The setting unit 1602 sets a power supply voltage of the semiconductor integrated circuit 100. Specifically, the setting unit 1602 performs initial power supply voltage setting and increases or decreases the power supply voltage. The setting with the setting unit 1602 may be operated by a user or automatically.

The executing unit 1603 reads the net list 710 of the semiconductor integrated circuit 100 after the replacement with the test circuit 110 to execute a predetermined test program. The judging unit 1604 judges whether the operation can be achieved with the voltage set by the setting unit 1602, based on a result of the test executed by the executing unit 1603. The setting unit 1602 increases or decreases the voltage depending on a result of judgment. The executing unit 1603 executes the test program again with the increased or decreased voltage. The determining unit 1605 determines an optimum voltage of the power supply of the semiconductor integrated circuit 100 depending on a result of the test executed by the executing unit 1603.

The functions of the acquiring unit 1601, the setting unit 1602, the executing unit 1603, the judging unit 1604, and the determining unit 1605 described above are achieved by the CPU 601 executing a program recorded on a recording medium such as the ROM 602, the RAM 603, the HD 605 shown in FIG. 6, for example, or by the I/F 609.

Figure 17:
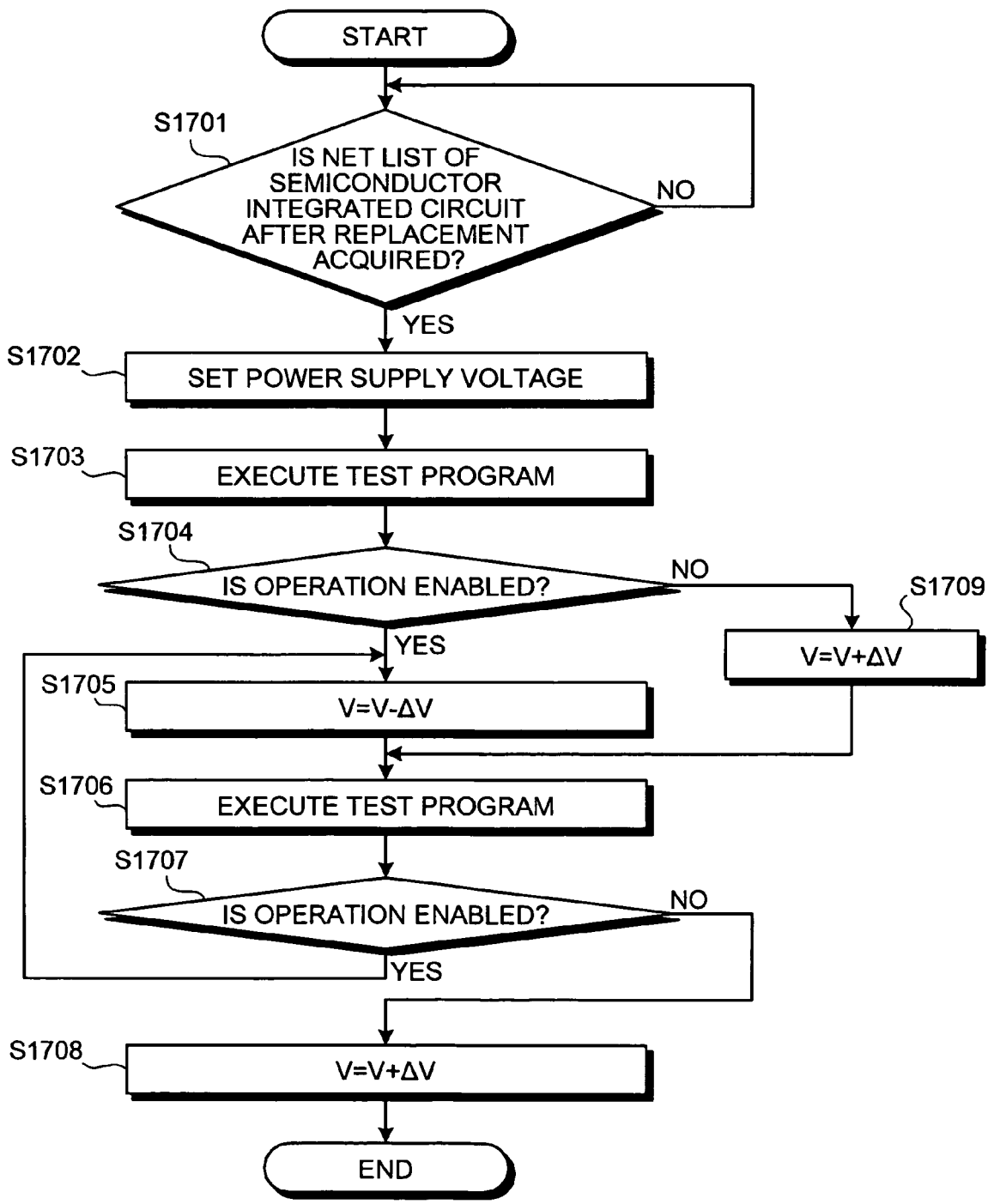
FIG. 17 is a flowchart of a design support processing by the design support apparatus according to the sixth embodiment.

FIG. 17 is a flowchart of a design support processing by the design support apparatus 1600. The acquiring unit 1601 waits for acquiring the net list 710 of the semiconductor integrated circuit 100 after the replacement with the descriptive data of the test circuit 110 (test circuit descriptive data) (step S1701: NO).

When the net list 710 is acquired (step S1701: YES), the setting unit 1602 sets an initial voltage V of the power supply (step S1702). The executing unit 1603 executes the test program (step S1703) to decide whether the semiconductor integrated circuit 100 operates with the set voltage V (step S1704). If the semiconductor integrated circuit 100 operates (step S1704: YES), the voltage V is reduced by a predetermined voltage ΔV (step S1705) and the executing unit 1603 executes the test program again (step S1706).

On the other hand, if the semiconductor integrated circuit 100 does not operate (step S1704: NO), the power supply voltage V is increased by the predetermined voltage ΔV (step S1709) and the executing unit 1603 executes the test program again (step S1706). After the test program is executed again (step S1706), it is judged whether the semiconductor integrated circuit 100 operates with the power supply voltage V increased or decreased by the predetermined voltage ΔV (step S1707).

If the semiconductor integrated circuit 100 operates (step S1707: YES), the procedure returns back to step S1705. On the other hand, if the semiconductor integrated circuit 100 does not operate (step S1707: NO), the power supply voltage V is increased by the predetermined voltage ΔV (step S1708) and that power supply voltage V is determined as the optimum power supply voltage of the semiconductor integrated circuit 100.

According to the sixth embodiment, since the actual power supply voltage of the semiconductor integrated circuit 100 can be set to an optimum value, for example, the minimum power supply voltage necessary for the operation, the power consumption can be reduced. Although the sixth embodiment is described by taking the voltage of the power supply as an example, the optimization can be performed for other parameters relating to various operating environments, for example, operating temperatures.

A design supporting method described in the embodiments can be achieved by executing a program prepared in advance with a computer such as a personal computer and a workstation. The program is recorded on a computer-readable medium such as a HD, an FD, a CD-ROM, a MO, and a DVD and is read from the recording medium by the computer for execution. The program may be a transmission medium that can be distributed through a network such as the internet.

According to the embodiments described above, an inexpensive high-speed test can be performed under a similar environment as an environment of an actual device.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A design support apparatus comprising:
    an acquiring unit configured to acquire, from information on a semiconductor integrated circuit, information on a first circuit element that captures a data signal output from a source circuit element within the semiconductor integrated circuit and to acquire information on the source circuit element based on a result of a timing analysis on the semiconductor integrated circuit;
    a replacing unit configured to replace, based on a layout of the semiconductor integrated circuit, the information on the first circuit element with information on a test circuit that includes:
    the first circuit element;
    a second circuit element configured to capture a data signal output from the source circuit element;
    a delay element configured to delay operation timing of the second circuit element compared to operation timing of the first circuit element;
    a comparing circuit configured to compare a value of the data signal captured by the first circuit element with a value of the data signal captured by the second circuit element; and
    a collecting circuit configured to collect a result of comparison by the comparing circuit; and
    an executing unit configured to read a net list of the semiconductor integrated circuit where the information on the first circuit element is replaced with the information on the test circuit and to execute a predetermined test.

2. The design support apparatus according to claim 1, wherein the delay element is configured to switch clock signal outputs to the second circuit element.

3. The design support apparatus according to claim 1, further comprising:
    a critical-path detecting unit configured to detect a critical path in the semiconductor integrated circuit from a result of a timing analysis on the semiconductor integrated circuit;
    a signal detecting unit configured to detect a signal for transmitting a data signal through the critical path;
    an executing unit configured to execute a test on the semiconductor integrated circuit with a plurality of types of test programs based on replaced information;
    a generating unit configured to generate a combination of test programs, the combination using minimum number of types of test programs selected from among the test programs, based on a result of detection by the signal detecting unit and a result of the test executed by the executing unit.

4. The design support apparatus according to claim 1, further comprising:
    a setting unit configured to set a voltage of a power supply of the semiconductor integrated circuit based on the replaced information;
    an executing unit configured to execute a test on the semiconductor integrated circuit with a test program based on the replaced information;
    a judging unit configured to judge whether the semiconductor integrated circuit operates at set voltage based on a result of the test executed by the executing unit; and
    a determining unit configured to determine a lowest voltage of the power supply with which the semiconductor integrated circuit operate, based on a result of judgment by the judging unit.

5. A design support method comprising:
    acquiring, from information on a semiconductor integrated circuit, information on a first circuit element that captures a data signal output from a source circuit element within the semiconductor integrated circuit, and information on the source circuit element based on a result of a timing analysis on the semiconductor integrated circuit;
    replacing, based on a layout of the semiconductor integrated circuit, the information on the first circuit element with information on a test circuit that includes the first circuit element, a second circuit element configured to capture a data signal output from the source circuit element, a delay element configured to delay operation timing of the second circuit element compared to operation timing of the first circuit element, a comparing circuit configured to compare a value of the data signal captured by the first circuit element with a value of the data signal captured by the second circuit element, and a collecting circuit configured to collect a result of comparison by the comparing circuit;

reading a net list of the semiconductor integrated circuit where the information on the first circuit element is replaced with the information on the test circuit; and executing a predetermined test.

6. A computer-readable recording medium that stores therein a computer program for realizing a design support method, the computer program making a computer execute:

acquiring, from information on a semiconductor integrated circuit, information on a first circuit element configured to capture a data signal output from a source circuit element within the semiconductor integrated circuit, and information on the source circuit element based on a result of a timing analysis on the semiconductor integrated circuit;

replacing, based on a layout of the semiconductor integrated circuit, the information on the first circuit element with information on a test circuit that includes the first circuit element, a second circuit element configured to capture a data signal output from the source circuit element, a delay element configured to delay operation timing of the second circuit element compared to operation timing of the first circuit element, a comparing circuit configured to compare a value of the data signal captured by the first circuit element with a value of the data signal captured by the second circuit element, and a collecting circuit configured to collect a result of comparison by the comparing circuit;

reading a net list of the semiconductor integrated circuit where the information on the first circuit element is replaced with the information on the test circuit; and executing a predetermined test.

\* \* \* \* \*